US006441359B1

(12) United States Patent
Cozier et al.

(10) Patent No.: US 6,441,359 B1
(45) Date of Patent: Aug. 27, 2002

(54) NEAR FIELD OPTICAL SCANNING SYSTEM EMPLOYING MICROFABRICATED SOLID IMMERSION LENS

(75) Inventors: Kenneth B. Cozier, Stanford; Daniel A. Fletcher, Menlo Park; Gordon S. Kino, Stanford; Calvin F. Quate, Stanford; Hyongsok T. Soh, Stanford, all of CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/414,674

(22) Filed: Oct. 7, 1999

Related U.S. Application Data

(60) Provisional application No. 60/104,901, filed on Oct. 20, 1998.

(51) Int. Cl.[7] .............................. G02B 7/02; G02B 21/06
(52) U.S. Cl. ........................................ 250/216; 250/234
(58) Field of Search ................................ 250/216, 234, 250/235, 236, 227.11, 306, 307; 359/664; 369/44.14, 44.15, 44.16, 112, 13, 14

(56) References Cited

U.S. PATENT DOCUMENTS

| 5,004,307 A | 4/1991 | Kino et al. ................... 350/1.2 |
| 5,121,256 A | 6/1992 | Corle et al. ................... 359/664 |
| 5,272,330 A | 12/1993 | Betzig et al. ................ 250/216 |
| 5,288,997 A | 2/1994 | Betzig et al. .......... 250/227.26 |
| 5,288,998 A | 2/1994 | Betzig et al. .......... 250/227.26 |
| 5,354,985 A | 10/1994 | Quate ......................... 250/234 |
| 5,479,024 A | 12/1995 | Hillner et al. ............ 250/458.1 |
| 5,497,359 A | 3/1996 | Mamin et al. ............ 369/44.15 |
| 5,517,280 A | 5/1996 | Quate .......................... 355/71 |
| 5,581,083 A | 12/1996 | Majumdar et al. .......... 250/306 |
| 5,666,190 A | 9/1997 | Quate et al. ................... 355/71 |
| 5,831,797 A | 11/1998 | Schaenzer et al. .......... 360/114 |
| 5,859,814 A | * 1/1999 | Kino et al. .................... 369/13 |
| 5,930,434 A | 7/1999 | Mowry et al. ............... 385/124 |
| 5,939,709 A | 8/1999 | Ghislain et al. ............. 250/216 |

FOREIGN PATENT DOCUMENTS

| JP | 2000-199737 A | * 7/2000 |
| JP | 2000-235038 A | * 8/2000 |

OTHER PUBLICATIONS

Wise, K.D. et al. Solid–state processes to produce hemispherical components for inertial fusion targets. *J. Vac. Sci. Technol.*, vol. 18, No. 3, pp. 1179–1182 (Apr. 1981).

Wise, K.D. et al. "Fabrication of hemispherical structures using semiconductor technology for use in thermonuclear fusion research", *J. Vac. Sci. Technol.*, vol. 16, No. 3, pp. 936–939 (May/Jun. 1979).

* cited by examiner

*Primary Examiner*—Stephone Allen
(74) *Attorney, Agent, or Firm*—Dorsey & Whitney LLP

(57) ABSTRACT

A solid immersion lens integrated on a flexible support such as a cantilever or membrane is described, together with a method of forming the integrated structure.

43 Claims, 10 Drawing Sheets

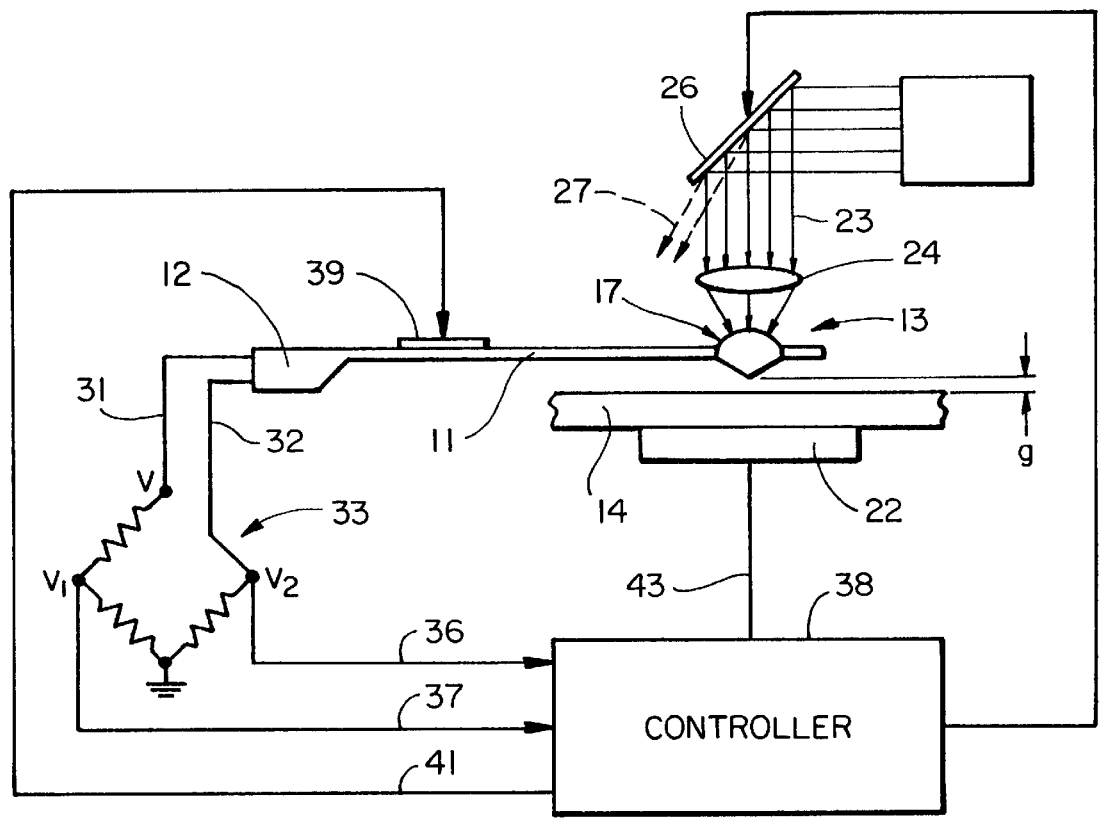
FIG_1
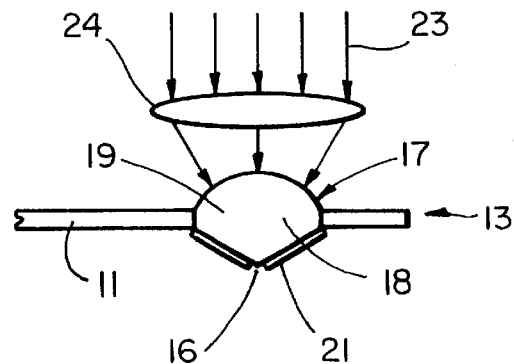
FIG_5

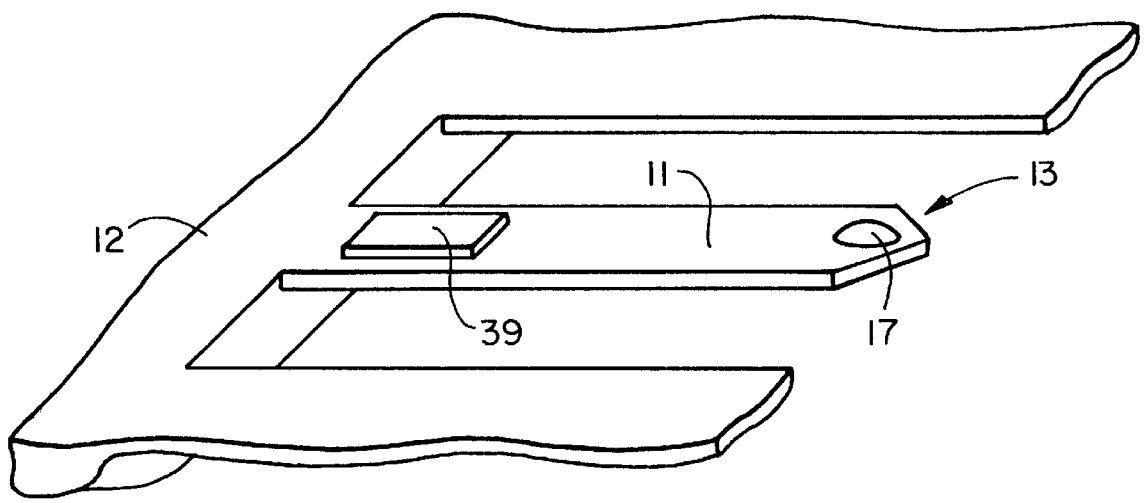
FIG_2
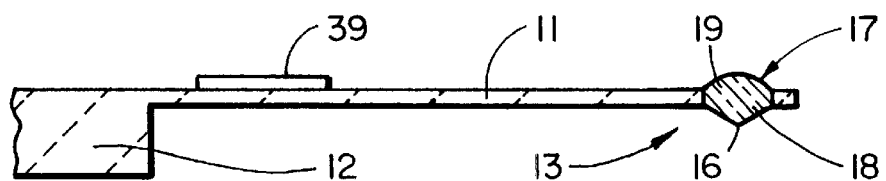
FIG_3
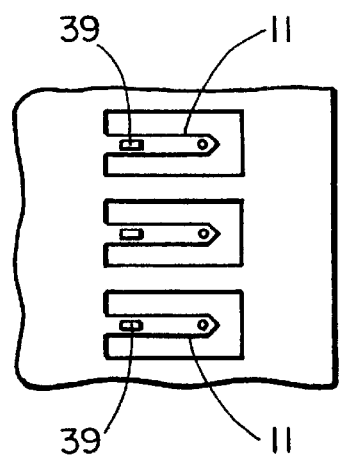
FIG_4

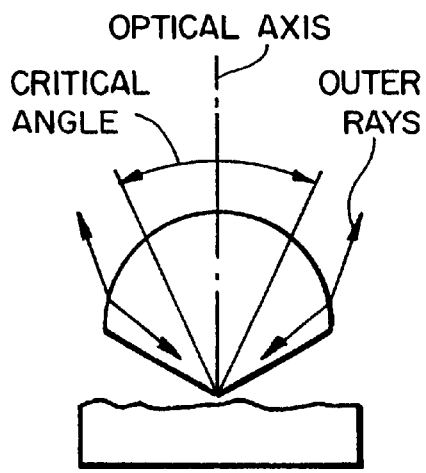
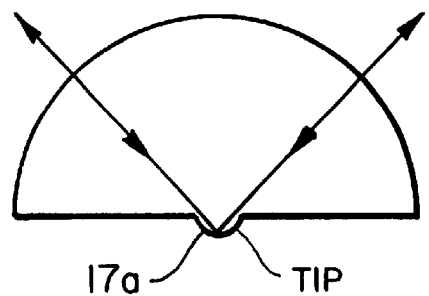
FIG_6
FIG_7
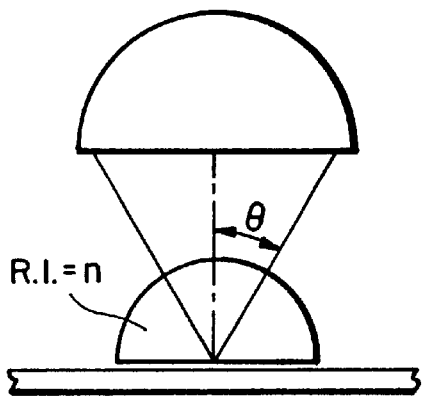
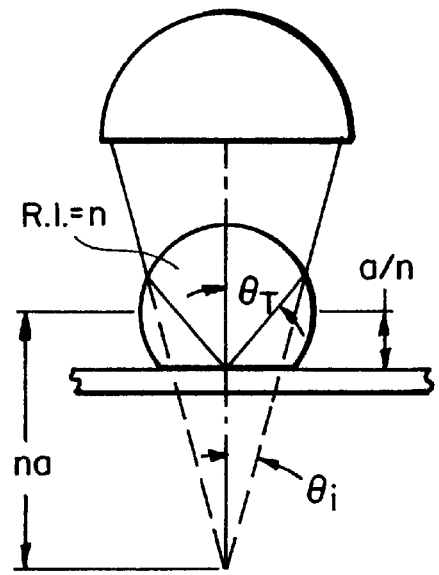
FIG_8
FIG_9

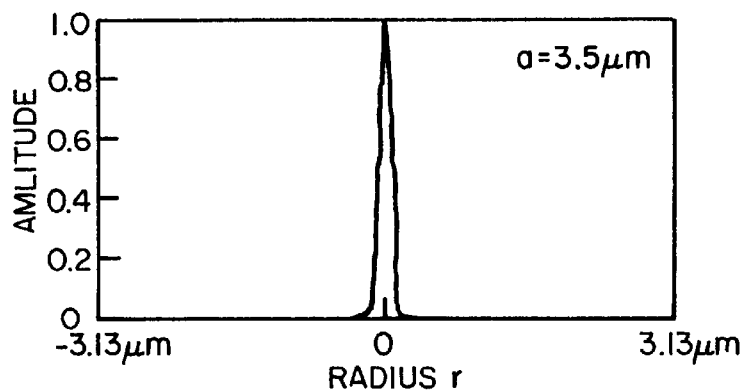
FIG_10A
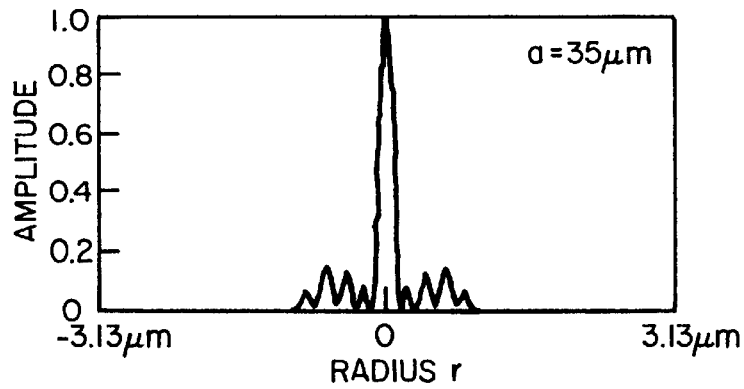
FIG_10B
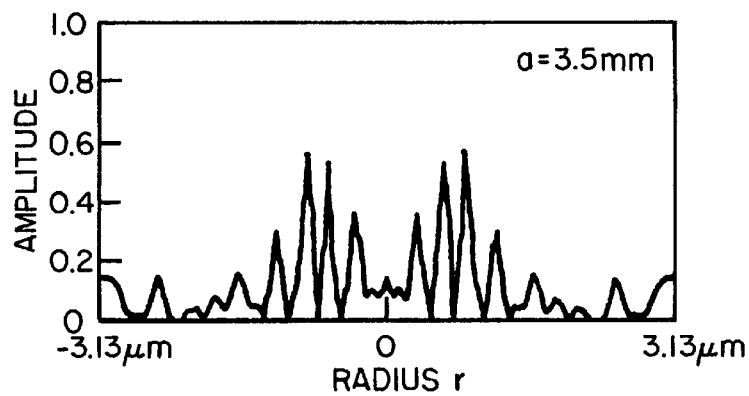
FIG_10C

FIG_11.1
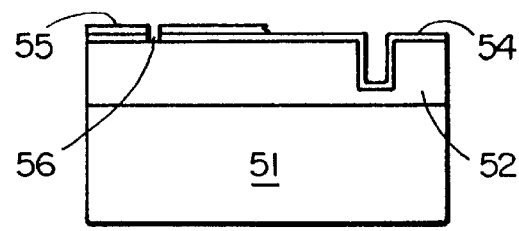
FIG_11.4
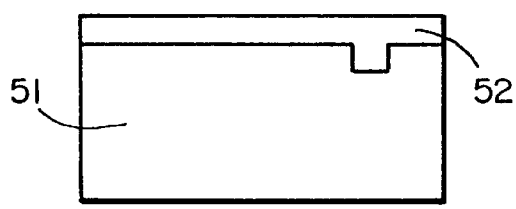
FIG_11.2
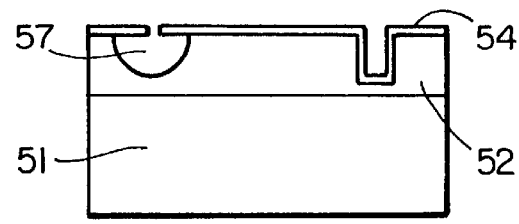
FIG_11.5
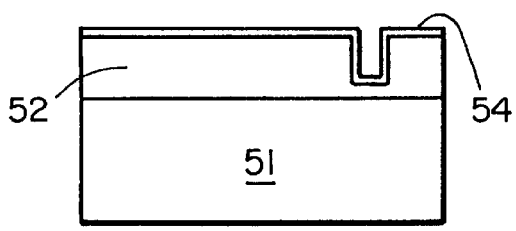
FIG_11.3
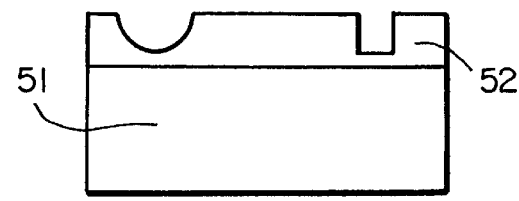
FIG_11.6
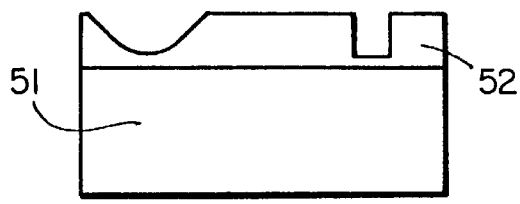
FIG_11.7

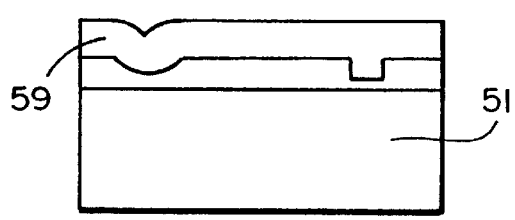
FIG_11.8
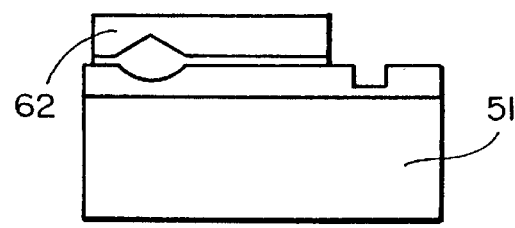
FIG_11.11
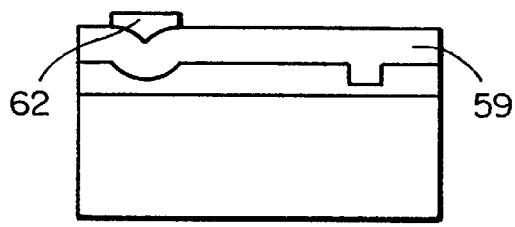
FIG_11.9
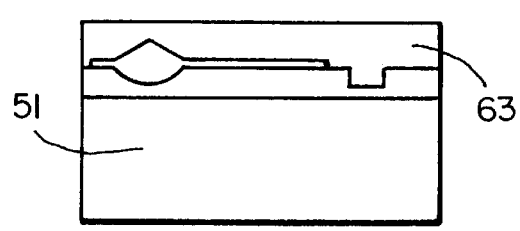
FIG_11.12
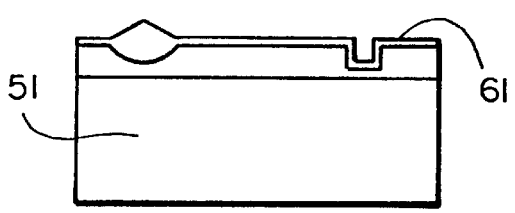
FIG_11.10
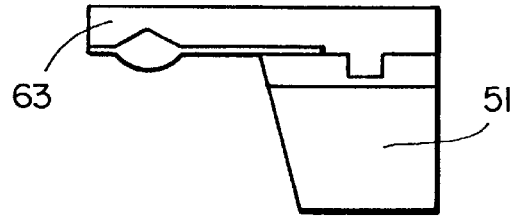
FIG_11.13
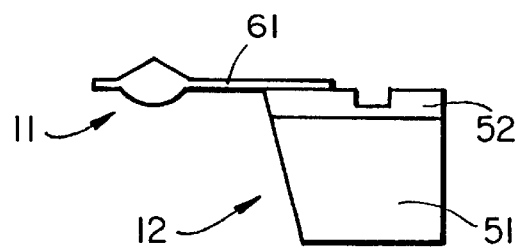
FIG_11.14

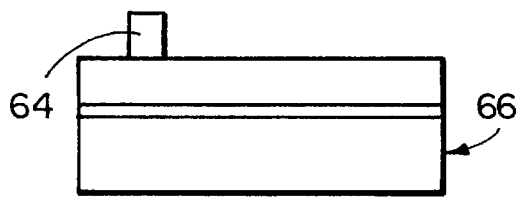
*FIG_12.1*
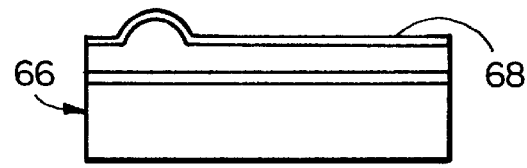
*FIG_12.4*
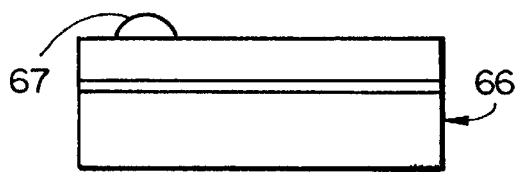
*FIG_12.2*
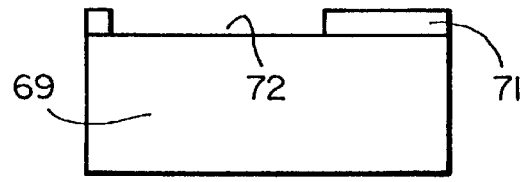
*FIG_12.5*
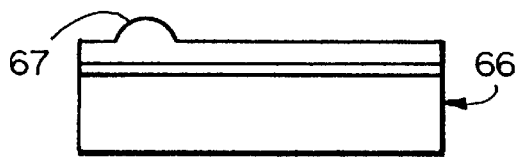
*FIG_12.3*
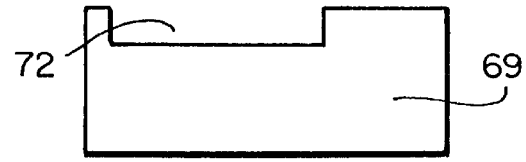
*FIG_12.6*
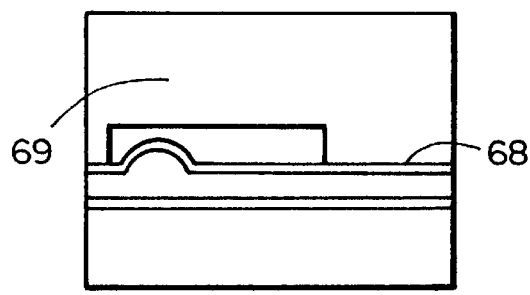
*FIG_12.7*

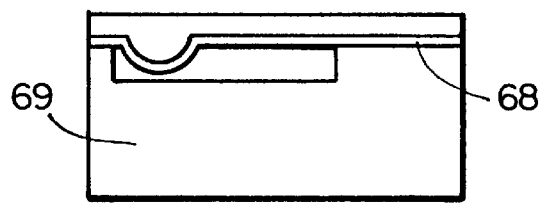
*FIG_12.8*
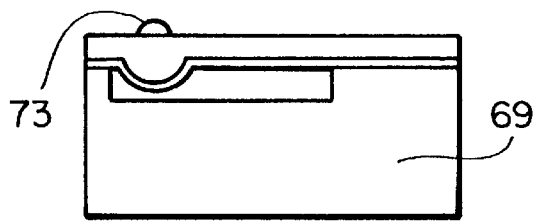
*FIG_12.9*
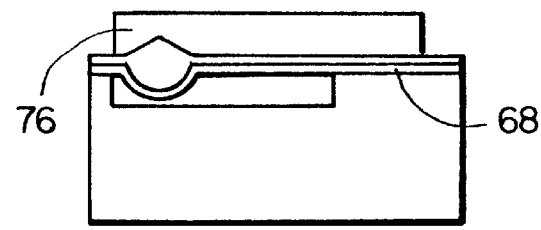
*FIG_12.11*
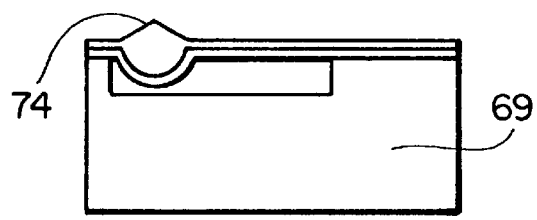
*FIG_12.10*
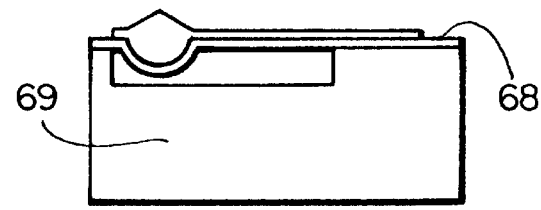
*FIG_12.12*
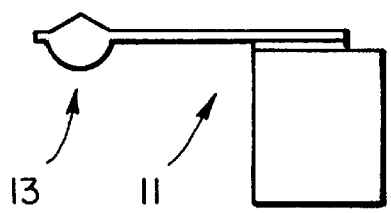
*FIG_12.13*

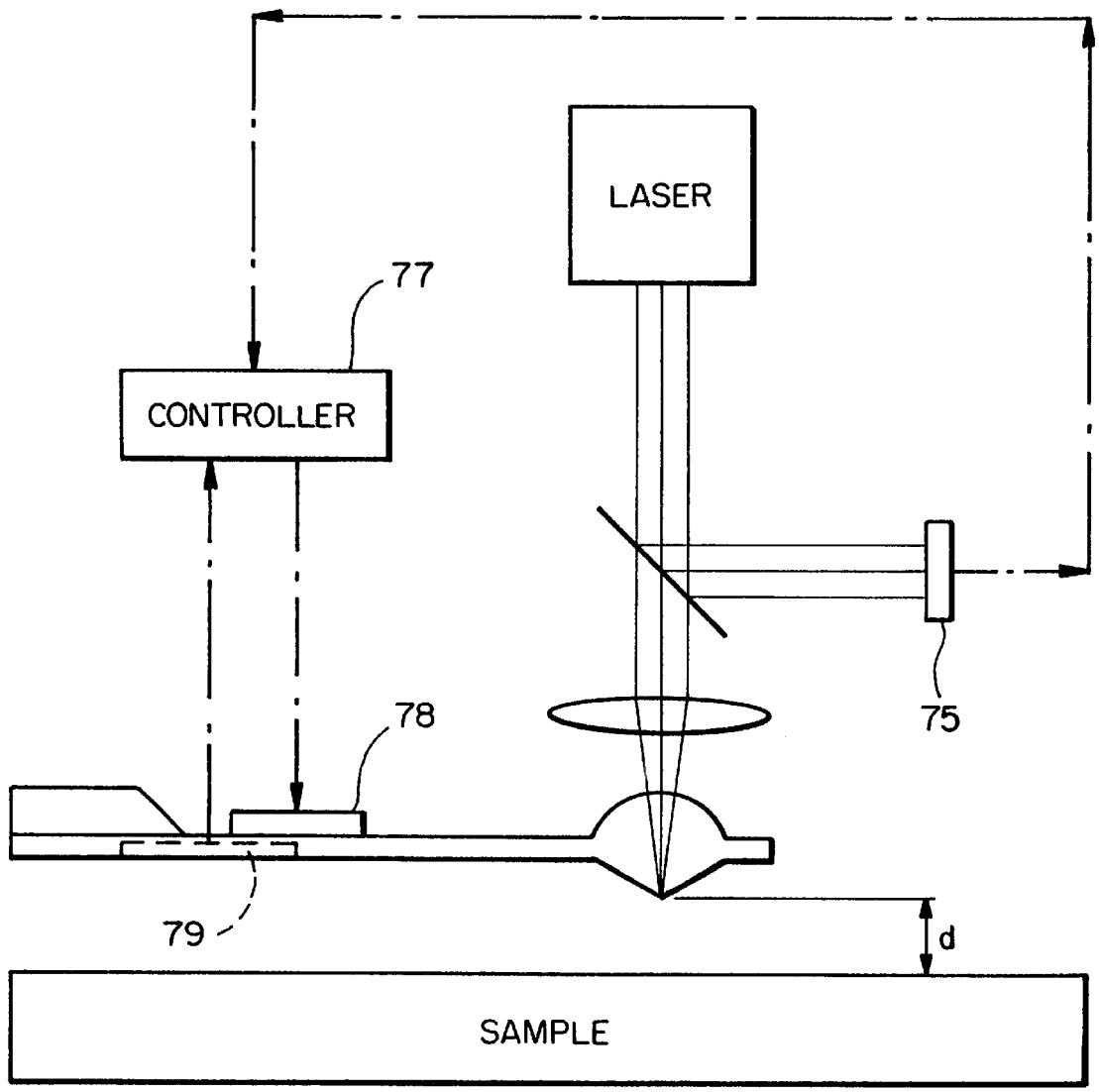
FIG_13

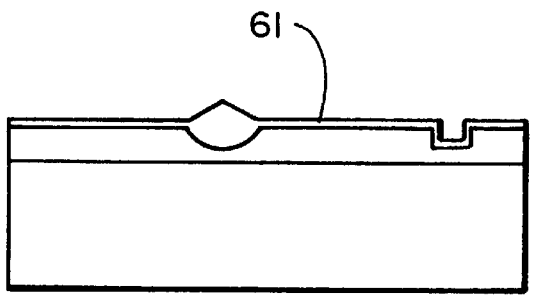
FIG_14.1
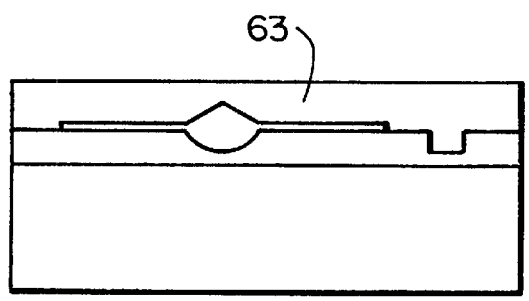
FIG_14.3
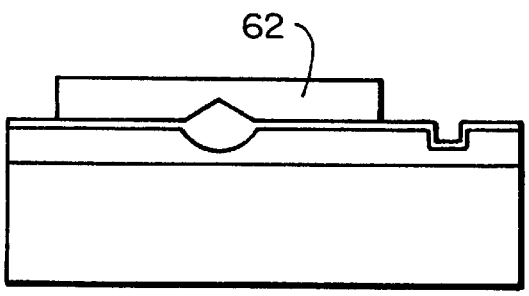
FIG_14.2
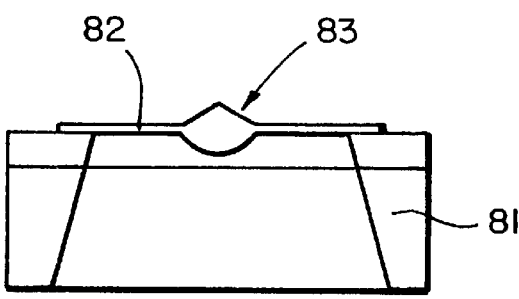
FIG_14.4
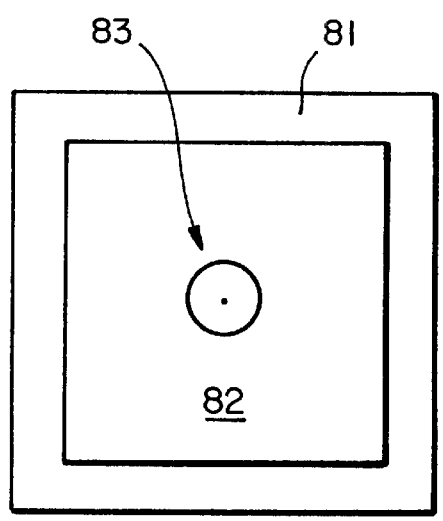
FIG_15

NEAR FIELD OPTICAL SCANNING SYSTEM EMPLOYING MICROFABRICATED SOLID IMMERSION LENS

Prior Applications

This application claims priority to Provisional Application Ser. No. 60/104,901 filed Oct. 20, 1998.

GOVERNMENT SUPPORT

This invention was made with Government support under Contract Nos. JSEP/ONR N00014-91-J-1050 awarded by the United States Department of the Navy, and Department of Energy Contract No. DEFG03-90ER14157. The Government has certain rights to this invention.

BRIEF DESCRIPTION OF THE INVENTION

This invention relates generally to a scanning system employing near field optics, and more particularly to a system which includes solid immersion lenses mounted on cantilevers and to methods of fabricating the cantilevers with integral solid immersion lens.

BACKGROUND OF THE INVENTION

Near field optical scanning has in recent years been applied to optical imaging, magneto-optic (MO) storage and lithography. In near field optical scanning, light pixels of sub-wavelength dimensions are achieved by scanning an aperture of sub-wavelength dimensions or by scanning a solid immersion lens very close to a sample.

A photolithography system employing near field optics is described in U.S. Pat. No. 5,517,280 which is incorporated herein in its entirety by reference. The photolithography system described in the '280 patent includes an array of cantilevers, preferably formed in a silicon wafer. Each cantilever includes a transparent pyramidical or conical tip located near the free end of the cantilever.

The array of cantilevers is positioned adjacent a wafer which is to be lithographed, in the manner of an atomic force microscope operating in the attractive mode. Each cantilever is a compound structure, including a thick portion and a thin portion, the latter having a preselected mechanical resonant frequency. The cantilevers are caused to vibrate at their resonant frequency and the actual frequency of vibration is detected and used to maintain a uniform spacing between the tip of the cantilever and the surface of a photoresist layer which is to be exposed. Both the vibrational motion and the control of the tip-photoresist spacing are effected by means of a capacitive plate located adjacent the cantilever.

The cantilever array is scanned over a photoresist layer on the wafer, preferably in a raster pattern, and the individual light switches are operated so as to expose individual pixels on the photoresist layer to pattern the photoresist.

Another approach for high resolution lithography, optical microscopy or MO storage is to use near field optical imaging techniques for forming the spot or pixel. In near field optical imaging techniques, a sharp tip (usually an optical fiber) is raster scanned across a surface and is used to collect or deliver light. With sharp tips, resolutions of 12 nm have been obtained. These fibers are typically made by stretching and heating an optical fiber to narrow it and then cleaving it. The tapered tip of the fiber is then coated with metal (to prevent light from leaking out the sides) except at the very end of the tip to form an aperture.

Tapered fibers do not propagate waves in the region where the diameter of the waveguide is less than approximately $\lambda/2n$ where n is the refractive index of the fiber, so in this tapered region the waveguide is cut off and the losses are exponential with distance. Hence, optical fiber probes with 100 nm apertures typically have transmission efficiencies of $10^{-5}$ to $10^{-6}$. Thus, tapered optical fiber probes typically have very poor efficiency, making them unsuitable for high speed lithography, scanned imaging, microscopy or optical storage. Furthermore, the probes are usually manufactured singly and are difficult to integrate into arrays, which prevents their use for parallel imaging, lithography or optical storage.

An enhancement of the near-field technique involves the addition of a solid immersion lens (SIL) to the optical system. The use of an SIL in a lithographic application has been discussed by T. R. Corle, G. S. Kino, and S. M. Mansfield in U.S. Pat. No. 5,121,256 (issued Jun. 9, 1992). The SIL in that arrangement has a hemispherical surface on one side of the lens to improve the coupling of light into the lens, and a flat surface on an opposing side of the lens facing the sample. Evanescent fields just outside the flat surface of the SIL improve the resolution by a factor of $1/n_{SIL}$, where $n_{SIL}$ is the index of refraction of the material from which the lens was made. For typical materials, $n_{SIL}=1$ to 2.5, so that a microlithography system which was capable of 0.5 µm resolution will be capable of 0.2 to 0.25 µm resolution with an SIL.

Solid immersion lenses may be used in applications other than lithography. The addition of an SIL to a microscopic imaging system has been described by G. S. Kino and S. M. Mansfield in U.S. Pat. No. 5,004,307 (issued Apr. 2, 1991). The addition of an SIL to an optical recording system has been disclosed by T. R. Corle, G. S. Kino, and S. M. Mansfield in U.S. Pat. No. 5,125,750 (issued Jun. 30, 1992).

OBJECTS AND SUMMARY OF THE INVENTION

It is an object of the present invention to provide an optical scanning system which includes one or more cantilevers. Each cantilever includes a tip near its free end which comprises a solid immersion lens and a conical or pyramidical tip which may be sharp or flat at its end. The tip efficiently guides impinging electromagnetic energy to the aperture. The electromagnetic energy can be in the form of ultraviolet (UV), infrared or visible light. The light impinging on the tip is digitally controlled whereby to form pixels on an associated surface for lithography, storage or microscopy. In operation, the tip of the cantilever(s) is brought very close to the surface to be scanned and the tips and surface are moved relative to one another whereby to scan a plurality of electromagnetic pixels or spots on the surface. A feedback control controls the distance between the surface and the tip to assure that the tip is operated in the near field mode.

It is a general object of the present invention to provide a cantilever with a tip including a solid immersion lens with a conical or pyramidical tip and to a method of fabrication.

It is another object of the present invention to provide an array of tips with optical near field apertures integrated on cantilevers and to a method of fabrication.

It is a further object of the present invention to provide a method of fabricating extremely small lenses of a few microns diameter for use in multiple lens arrays.

It is another object of the present invention to provide an extremely small aspheric solid immersion lens and to a method of fabrication.

The foregoing and other objects of the invention are achieved by a method of micromachining a solid immersion lens using chemical and plasma etching techniques. The micromachining method is extended to provide a cantilever or array of cantilevers each with a solid immersion lens at the tip. The invention also includes incorporating an array of such cantilevers into an optical scanning system.

BRIEF DESCRIPTION OF THE DRAWINGS

The fabrication and operation of a solid immersion lens, cantilever and optical scanning system in accordance with this invention will be more clearly understood by reference to the following drawings in which:

FIG. 1 is a block diagram of a control system for controlling the position of a tip on a single cantilever with respect to an object.

FIG. 2 is a perspective view of a cantilever with solid immersion lens in accordance with the invention.

FIG. 3, is a cross-sectional view of the cantilever of FIG. 2.

FIG. 4 is a top plan view of a wafer including a plurality of cantilevers.

FIG. 5 is an enlarged view of the free end of the cantilever showing the tip.

FIG. 6 shows a solid immersion lens with a beam focused into a wide angle tip.

FIG. 7 shows a hemispherical solid immersion lens with a beam focused into a small tip.

FIG. 8 is an enlarged view of a hemispherical solid immersion lens and an objective lens.

FIG. 9 is an enlarged view of an aplanatic focused solid immersion lens.

FIGS. 10A–10C show the point spread functions for solid immersion lenses of three diameters.

FIGS. 11.1–11.14 illustrate the cavity method of forming a cantilever with solid immersion lens tip.

FIGS. 12.1–12.13 illustrate the reflow method of forming a cantilever with solid immersion lens tip.

FIG. 13 is a block diagram of another system for controlling the cantilevers.

FIGS. 14.1–14.4 show the final steps of forming a membrane supported solid immersion lens tip.

FIG. 15 is a top plan view of the membrane supported solid immersion lens tip.

DESCRIPTION OF THE PREFERRED EMBODIMENT(S)

It will become apparent that the micromachined solid immersion lens and cantilever support of the present invention are useful in photolithography systems, optical scanning microscope systems, magneto-optic information storage and retrieval systems, etc. To better appreciate the invention, a lithography system employing the invention is first generally described. The system includes an array of cantilevers with each cantilever in the array having a tip integrated into the end of the cantilever which is typically made of the same material as the cantilever, such as silicon for infrared use or SiN for use in the ultraviolet or optical range. The tip includes a solid immersion lens and preferably a tip such as a pyramidical or conical tip. During the exposure process, the tip is maintained close to the substrate. The tip to sample distance is controlled by an optical lever deflection system. During exposure the sample is scanned by a scanning stage, and the light intensity at each lens is modulated so that a desired pixel pattern is exposed. The basic system, the cantilevers, and the cantilever array are schematically shown in FIGS. 1–5.

Referring to the Figures, cantilever 11 extends from the body 12 with its end 13 spaced from a sample or wafer 14 which is to be illuminated with the near field projecting from the end of the pyramidical tip 18 integral with solid immersion lens 19. The tip may be coated with a metal coating 21 of aluminum or titanium to form a small aperture 16. The aperture can be on the order of 50 nm in diameter. However, such a coating is not usually required. The beam passing through the SIL is focused on the tip 17, which is chosen to have a wide enough angle so that the beam does not hit its sides, as shown in FIG. 6. For a large numerical aperture of 0.8 or 0.9, this implies a taper with a half angle of 65° or more, as shown already for macroscopic machined lenses by Ghislain et al. [L. P. Ghislain, V. B. Elings, K. B. Crozier, S. R. Manalis, S. C. Minne, K. Wilder, G. S. Kino, and C. F. Quate, "Near-field photolithography with a solid immersion lens", Appl. Phys. Lett., 74(4), 501 (1999).]. The end of the tip typically has a radius of the order of 500 nm. This small radius enables the tip to be placed very close to even a rough surface and to be scanned in close proximity to an integrated circuit in which topography is not flat. However, the radius is chosen to be much larger than that typically used in a near-field scanning optical microscope (NSOM). This has the advantage that the tip does not get as easily damaged as in an NSOM and lasts for a time many orders of magnitude longer than does an NSOM tip. It is not always easy to micromachine such a wide angle tip as that illustrated in FIG. 6. Instead, it is adequate only to have the tip very small near its end. As an example, a configuration which is very simple to manufacture is illustrated in FIG. 7. In this case, the tip 17a is made in the same way as will be described for the SIL, and can be spherical in shape, but much smaller than the SIL. Since the SIL is only a few micrometers in diameter, the tip will be extremely small, of the order of 1 $\mu$m or less in diameter.

The sample is scanned by a suitable scanning stage such as a piezoelectric motion control stage 22. A collimated light beam 23 impinges upon an objective lens 24 and is focused onto the solid immersion lens 19. The light may for example be modulated by controlling the deflection of a micromachined mirror 26 associated with each of the cantilevers. That is the light may be directed into the lenses 24 or deflected as shown by dotted rays 27. By controlling the motion of the stage 22, and the modulation of the light beam 23, a selected pattern of light pixels are formed on the sample. In the case of photolithography, this forms the appropriate resist pattern. The light beam applied to each solid inmmersion lens in an array may be modulated by a micromachined mirror assembly such as sold by Texas Instruments, Inc., Dallas, Tex., under the name "Digital Micromirror Device".

The distance between the tip and the surface is maintained by a feedback cantilever bending system. Such control systems are well known and described in conjunction with atomic force microscopes, U.S. Pat. No. 5,883,705, near field scanning optical and ion microscopes, U.S. Pat. No. 5,354,985, and lithography systems employing cantilevers, U.S. Pat. No. 5,666,190, all of which patents are incorporated herein by reference. Referring to FIG. 1, cantilever 11 includes a piezoresistor (not shown) whose terminal are connected to lines 31 and 32. Lines 31 and 32 lead to a bridge circuit 33, which has terminals connected between a voltage V and ground, respectively. The remaining terminals $V_1$, $V_2$, of bridge circuit 33 are connected via lines 36 and 37 and to a controller 38.

Bridge circuit 33 is used to detect the resistance of the piezoresistor within cantilever 11. Assuming that the resistance of the piezoresistor and each of the resistors in bridge circuit 33 is equal to R, $V_1=V_2$ when the cantilever is undeflected. When it is deflected so that the resistance of the piezoresistor becomes $R+\Delta R$, the difference between $V_1$ and $V_2$ is expressed as follows:

$$V_1 - V_2 = V \frac{\Delta R}{4R}$$

Thus, as cantilever 11 vibrates, the voltage difference $V_1-V_2$ oscillates at the same frequency, and this differential voltage is used to detect the frequency at which cantilever 11 is vibrating. This signal is delivered to controller 38 via lines 36 and 37.

Cantilever 11 is positioned with its tip extremely close to a substrate 14 to be imaged. The top of the substrate may be coated with photoresist after lithography or may be a magneto-optic material covered with a transparent protective layer for optical storage. A gap g, which is less than the diameter of the aperture, separates the tip from the surface of the wafer 14.

Piezoelectric actuator 39 is positioned on cantilever 11. Controller 38 delivers an AC signal to the actuator 39 that causes the outer portion of cantilever 11 (i.e. the "vibrating" section) to vibrate.

As the gap g varies, the resonant frequency of cantilever 11 also varies due to variations in the attractive forces between the tip of cantilever 11 and wafer 14. Using the output of bridge circuit 38, a rectifier (not shown) within controller 33 converts the vibrational frequency of cantilever 11 into a DC voltage, and a comparator (not shown) within controller 38 compares the DC voltage to a known reference voltage. The difference between these voltages constitutes an error voltage, and controller 38 sends a corresponding DC error signal over line 41 to piezoelectric actuator 39. This causes the cantilever to flex. Cantilever 11 continues to flex until the gap g is adjusted to the proper level, indicating the correct spacing for proper exposure of the photoresist on the surface of wafer 14. The signal sent by controller 38 over line 41 is an AC-DC signal, the AC component causing cantilever 11 to vibrate, and the DC component representing an error signal which adjusts the bending of cantilever 11.

Controller 38 actuates the piezoelectric scanning stage 22 via a line 43, causing wafer 14 to oscillate back and forth, and to step across the tip 18. The combined oscillatory and stepping motion creates a raster scanning pattern.

Controller 38 controls the light input to cantilever 11 by providing a signal over line 44 to scanning mirror 26, which controls the light applied to the solid immersion lens. The operation of the mirror 26 is coordinated with the movement of the scanning stage 22, in a known manner, so that each pixel on the surface of wafer 14 is either exposed or not exposed, as necessary to create the desired photolithographic pattern on the photoresist coating the surface of wafer 14. It is apparent that a similar system can be used for magneto-optic recording or for optical microscopy.

The resolution of any system depends upon the spot size of the light which strikes the surface. The spot or pixel size in an optical imaging, magneto-optic storage or lithography system is given by the diffraction limit to be approximately $\lambda/2$ NA. This is the distance between half power points when light of wavelength $\lambda$ is focused by an optical system of numerical aperture NA. Therefore the resolution may be improved by reducing the wavelength or by increasing the numerical aperture. The numerical aperture (NA) is given by $n \sin \theta_0$, where n is the refractive index of the material and $\theta$ is the half angle that the light beam subtends at the focal point. The Solid Immersion Lens (SIL) improves the resolution of an imaging, lithography or data storage system by increasing the refractive index of the material into which the light is focused. For example, in the case of a silicon nitride SIL, the refractive index is approximately 2.0 (compared to n=1.0 for air), so that the spot size is decreased by a factor of 2.0.

In the foregoing example, the SIL 19 was placed between the objective lens 24 and the sample of interest. In FIGS. 8 and 9, two types of SILs in which the SIL lens surfaces are spherical are shown. For the hemisphere SIL, FIG. 8, the center of the sphere is at the focal point of the objective. Therefore, rays enter the SIL along its radii and converge at its center. As discussed earlier, the effective numerical aperture of the lens system is increased by a factor of n, the refractive index of the lens material. The system is a near field system because normally the large angle rays are totally internally reflected at the lower surface of the SIL and the fields associated with these rays fall off with distance from this surface. Hence the gap between the surface and the substrate must be very small, on the order of 50 nm.

The second form of the SIL shown in FIG. 9 makes use of aplanatic focusing into the sphere of radius a. The incident beam is focused to a point a distance na from the center of the sphere and due to refraction at the surface of the SIL, perfect focus is obtained inside the SWL at a point a distance a/n from the center of the spherical surface. Therefore, the numerical aperture of the system is increased by $n^2$, allowing the use of a relatively low aperture objective. The input beam must be incident on the SIL at a point on the spherical surface above the focal point on the sphere where the angle $\theta_T$ to the axis of the refracted ray is $\pi/2$. Thus, the maximum angle of incidence $\theta_i$ is given by $\sin \theta_i = 1/n$ and the maximum effective numerical aperture that can be obtained is $NA_{eff}=n$.

A third form of the SIL is when the curved surface of the lens is of an aspheric shape. If the shape of the SIL is chosen to be elliptical in shape, then it is not necessary to use an objective lens 24. The SIL focuses a parallel input beam, removing the spacing tolerance between the objective lens and the SIL. Alternatively, a weakly focused beam from a low aperture objective can be used with the correct shape of aspheric lens.

To summarize, in all three forms of the SIL, the spot size (here defined as the distance between half power points) is given by $\lambda/2$ $NA_{eff}$. For the hemisphere SIL, $NA_{eff}=n \sin \theta$. For the supersphere, $NA_{eff}=n^2 \sin \theta$ and the maximum $NA_{eff}$ is n. For the asphere, with the shape chosen to be elliptical and to focus a parallel beam, the maximum $NA_{eff}$ is $\sqrt{n^2-1}$.

Further improvements to the resolution can be made by coating the bottom surface of the pyramid 18 with an optically opaque film (e.g. a metal) that has a small aperture 16 at the focal point. The spot size will then be approximately equal to the size of the aperture, as long as the sample is very close to the aperture, usually less than the diameter. The conventional diffraction limit does not apply here because in this case the sample is in the optical near field of the aperture (i.e. it is very close to it).

In the present invention, the SIL is formed by micromachining techniques. It is monolithically integrated with a cantilever. By shrinking the size of the SWL through the use of micromachining, lens aberrations are significantly reduced. For a $\pi/2$ wave aberration, the tolerance on the length of the hemisphere SIL is given by $$\Delta z_{max} = \sqrt{\frac{2a\lambda}{2n(n-1)\sin^4\theta_0}}.$$

The ratio of the length tolerance $\Delta z_{max}$ to the radius of the lens a is therefore proportional to $1/\sqrt{a}$. Hence by decreasing the radius a, the length tolerance will be easier to satisfy (S. M. Mansfield, "Solid Immersion Microscopy", PhD Dissertation, Department of Applied Physics, Stanford University (March 1992)).

In the case of the supersphere SIL, the length tolerance is given by the approximate formula:

$$\Delta z_{max} \approx \frac{n\lambda}{(n^2-1)2\sin^2\theta_0}$$

This shows that the length tolerance remains the same in value as the lens is scaled in size. Hence for a smaller lens, the length tolerance $\Delta z_{max}$ represents a larger proportion of the radius of the lens and hence is easier to satisfy.

As a further example of the advantages of using microlenses for eliminating aberrations, we have calculated with the optical design program ZEMAX the point spread function (PSF) of an imperfect hemispherical lens. We took the lens to be a hemisphere of radius a minus a parabola, $r=0.04_z{}^2$. The calculated point spread functions (PSFs) for three different values of the hemisphere radius a, 3.5 $\mu$m, 35 $\mu$m and 3.5 mm, with $\lambda=325$ nm and n=2, are shown in FIGS. 10A–10C. It will be seen that the PSF of the smallest lens has very low sidelobes, but as the radius of the hemisphere is increased, the sidelobes get worse. With the largest lens, the effect of the nonsphericity is to ruin the PSF. Furthermore, we observe that even though the lens is nonspherical, aberrations are negligible. We conclude that the requirement for a perfect spherical shape becomes less critical as the lens size is reduced to the microscopic dimensions of the order of a few microns proposed here.

Because the dimensions of the SIL cantilever are small, the cantilever has superior performance: higher resonance frequency, lower spring constant and the ability to operate the cantilever in tapping mode. The small size of SIL cantilevers allows them to be integrated into parallel array as schematically illustrated in FIG. 4. Parallel arrays of SIL cantilevers allow imaging, lithography and data storage to be done faster than with a single SIL cantilever.

Two method are proposed for photolithographically fabricating by chemical etching SILs from deposited films or the bulk substrates. The fabrication approaches, called the cavity method and the reflow method, differ mainly in the formation of the lens surface. The cavity method involves making a mold (e.g. on low-temperature oxide (LTO) which has the desired shape and then depositing the lens material onto the mold. The reflow method involves patterning a film (e.g. photoresist) on top of the lens material into the desired shape and then transferring the shape by etching into the underlying lens material.

The cavity fabrication process used for the SIL cantilevers can be used to make hemisphere, supersphere or aspheric SILs. The process can be used to make SILs of any material that can be deposited and etched. The basic process involves etching a cavity into which the lens material is deposited, etching the tip and cantilever and then releasing the cantilever so that it is freestanding.

FIGS. 11.1 through 11.14 show the steps for forming a cantilever 11 with integral tip 17 which includes a pyramidical tip 18 and SIL 19. The starting material is a silicon wafer 51. Because the process for the hemisphere SIL includes later planarization steps (steps 11.6 and 11.7), it is necessary to etch alignment marks 53 into the silicon (step 11.1). The second step is to deposit by low pressure chemical vapor deposition (LPCVD) a film of low temperature oxide (LTO) 52 on wafer 51. Following this, a film 54 of polysilicon is deposited by LPCVD (step 11.3). Pinholes 56 are then etched in the polysilicon film (step 11.4) by masking 55 and plasma etching. In step 11.5, the wafer is immetsed in diluted hydrofluoric acid (HF), allowing the LTO to be etched by the HF through the pinhole. If the etch is isotropic (i.e. the same rate in all directions), then a hemispherical cavity 57 will result if the pinhole is narrow compared to the final diameter of the cavity. Therefore the pinhole should be made as small as the lithographic technique will allow. Steps 11.6 and 11.7 are used for making a hemisphere SIL. If a supersphere SIL is being made, then steps 11.6 and 11.7 should be omitted. In step 11.6, the film 54 of step 11.5 is removed by plasma etching or wet (chemical) etching. In step 11.7, the wafer is immersed in hydrofluoric acid which etches the LTO isotropically. Therefore, the radius of curvature of the spherical depression is increased, but the height of the depression remains the same. Hence, the depression is no longer a hemisphere, i.e. the center of the sphere is actually at a point above the top surface of the LTO. In step 11.8, the lens material 59 is deposited. This could for example be silicon nitride deposited by plasma enhanced chemical vapor deposition (PECVD). For the applications of imaging, lithography and data storage, it is desirable that the SIL be able to transmit light with good efficiency at UV wavelengths. For silicon nitride deposited by PECVD, the deposition should be made ammonia rich to ensure good UV transparency (Kiermasz and Beekman, "Plasma CVD of Silicon Nitride: Process Design for Increased Flexibility", *Semiconductor International*, vol. 13, no. 7, June 1990, pp. 108–128). In step 11.9 the pyramidical tip 18 is defined by lithography to form mask 60, and in step 11.10 the tip is etched. In step 11.10, the process parameters of the etch should be chosen so that the etching is angular dependent. In the first part of the etching process, the photoresist circle or mask 60 serves as a mask and the result is a raised pedestal of silicon nitride. The photoresist is etched away itself during this process by the $O_2$ in the plasma. During the next part of the etch, the corners of the pedestal become faceted, at an angle equal to that at which the etch rate is fastest. As the pedestal is etched further, it becomes a tip, with a half angle equal to that at which the etch rate is fastest. For etching silicon nitride with $CHF_3+O_2$, it has been documented that, by varying the flow rates of the gases and the pressure, the maximum etch rate angle can be varied (A. M. Barklund and H. O. Blom, "Influence of different etching mechanisms on the angular dependence of silicon nitride etching", *J. Vac. Sci. Tech.*, A 11(4), Jul/Aug 1993). The etch is timed to leave the desired cantilever thickness 61 of silicon nitride. In step 11.11 the cantilevers are defined by photolithography 62 and etched. Step 11.12 involves spinning on a thick layer of polyimide 63 to protect the front side. Step, 11.13 involves lithography on the backside of the wafers, followed by etching in ethylene diamine pyrocatechol (EDP) to release the cantilever. The wafer is immersed in hydrofluoric acid to remove the LTO. In step 11.14, the polyimide is removed by dry etching (oxygen plasma). This leaves the cantilever 11 with integral solid immersion lens and tip supported by the body 12.

There are several ways in which the process described above may be modified. One would be to use a SOI wafer. Also, instead of LTO, any other material (amorphous or crystalline) for which isotropic etching is possible may be used. For example, silicon may be used. In this case, the etching would be done by a combination of acetic, hydrofluoric and nitric acids (HNA). Instead of using silicon nitride as the masking layer for the pinhole etch, a metal may be used. The SIL lens material may be another material that is possible to deposit in a thin film instead of silicon nitride. For example, silicon dioxide, polysilicon, silicon oxynitride, germanium, strontium titanate, lead sulfide and gallium phosphide. A separate series of steps may be added if it is desired that the cantilever be made of a different material to the SIL lens. Instead of using EDP. to release the cantilever, potassium hydroxide (KOH) or tetramethyl ammonium hydroxide (TMAH) may be used.

As described above, another method of forming the SIL in a cantilever is the reflow process. The reflow method uses the curved surface formed by reflowing photoresist to create the SIL or other lens on a cantilever. Pillars or other shapes formed in photoresist are reflowed thermally or in an acetone vapor environment to form a mask for the lens. The SIL is formed on a lens material, which can be the bulk substrate or a deposited film, by transferring the mask into the lens material with reactive ion etching (RIE). The selectivity (lens material : photoresist) of the etch process and the reflow conditions can be used to control the shape of the lens. A thin film is deposited or grown to form an etch stop for a later step. The lens material with SILs is then bonded to a support wafer with pits etched to protect the lens by anodic or other bonding methods. The bulk of the lens wafer is removed, leaving a thin layer of the lens material in which the lens tip and cantilever will be formed. If the lenses are made in silicon on an SOI wafer, the bulk substrate and buried oxide layers are removed, leaving only the top silicon layer. If the lenses are made in SiN deposited on Si, the bulk Si is removed leaving only the SiN layer. Tips are then formed with RIE opposite the lens in the layer of lens material held by the support wafer. Deposition of an opaque layer and creation of an aperture on the tip would take place at this stage if apertures are desired. Next, the cantilevers are masked and etched into the lens material with RIE, stopping on the thin film or other etch stop previously deposited or grown on the lens material. Finally, the thin film or other etch stop is removed with wet or dry etching and the cantilevers held by the support wafer are released by backside etching, wafer sawing, or other method.

An example of the above described reflow method process flow is given in FIGS. 12.1–12.13 for the case of Si lens material and Pyrex support material. In step 12.1, pillars 64 of photoresist are defined by depositing a photoresist film or layer on a SOI wafer 66 and masking and etching. In step 12.2, the photoresist pillars are reflowed by heating or placing them in an acetone environment so that they reflow under surface tension to form the hemisphere 67, step 12.3. The hemisphere shape is then transferred to the lens material (either the bulk substrate or a deposited layer) by dry etching the film hemispheres and underlying lens material with predetermined etch rates and degree of anisotropy. For example, if the etch rate of the film is the same as that of the lens material, and the etching is completely anisotropic, the precise shape of the hemisphere will be transferred to the lens material. If the etch rates are not equal, the lenses will be aspheric after transfer. Variations in dry etching parameters allow control of the lens shapes. In step 12.4 a thermal oxide layer 68 is grown on the surface to serve as an etch stop for backside processing. A cantilever support structure 69 is separately fabricated as for example from Pyrex. In steps 12.5 and 12.6 the Pyrex wafer is patterned by applying and patterning a photoresist 71 and then etching pits 72. In step 12.7, the Pyrex wafer is anodically bonded to the SOI wafer step 12.7 and the bulk silicon and the buried oxide removed to expose the backside of the lens, step 12.8. The pyramidical lens tip is then formed by defining the tip with photoresist 73, step 12.9, and etching, step 12.10 to form tip 74. In steps 12.11 and 12.12 the cantilevers are defined by patterning photoresist 76 and etching using the thermal oxide 68 as an etch stop. Finally, the exposed thermal oxide 68 is etched away and the Pyrex sawed to provide the cantilever 11 with tip 13.

If the SIL tip is metal coated, the aperture at the end of the metal-coated SIL tip may be formed in a number of ways among which are: i) focussed ion beam milling (FIB), ii) oxidation, iii) dry etching of a conformal masking layer, and iv) photoresist etchback.

In the focused beam technique, the SIL tip is coated with metal. Then the FIB tool would be is used to selectively remove the metal from the end of the tip to form the aperture. The ability of the FIB tool to both image and remove materials allows the aperture to be aligned to the end of the pyramidical tip 18.

An optically transparent aperture at the end of the tip of the solid immersion lens may be formed by oxidizing the metal coating. This increases the optical transparency. Furthermore, the metal oxide formed may be soluble in chemicals in which the metal itself is not (e.g. $CrO_3$ dissolves in water). Hence, oxidation of the metal may allow it to be selectively removed. In this method, a metal film is evaporated onto the pyramidical tip. Then the solid immersion lens cantilever is fitted into an AFM mechanism and the tip is brought into contact with a conducting sample, such as a heavily doped silicon wafer. The tip is biased positively (e.g. 12 V) for a sufficient time that the metal at the very end of the tip is oxidized. The force between the tip and the sample is controlled by the AFM mechanism to keep the tip and sample in contact, but is small enough to prevent the tip from being damaged. The humidity of the environment is controlled to allow the oxidation to proceed at the desired rate.

In the dry etching method, the tips are coated with the metal layer and then a conformal layer of silicon nitride is deposited. A protective layer of photoresist is then spun onto the tip to a thickness of approximately 1 $\mu$m. Following this, an anisotropic etch is performed and this step is timed so that the nitride will be etched at the apex of the tip to reveal the metal layer. This method relies on the curvature of the apex of the tip being less than at the sides of the tip. The smaller curvature of the tip means that the vertical thickness of the nitride will be less at the apex of the tip than on the sides. Hence, an anisotropic etch will etch through the nitride to the metal at the apex of the tip, but not all the way through at the sides of the tip. At the base of the tip, the curvature is smaller than at the sides, and hence these areas will need to be protected. The layer of photoresist will serve this purpose. Following the nitride etch, the next step is to etch the metal and the masking provided by the nitride layer will ensure that only the metal at the apex of the tip is etched.

The photoresist etchback differs from the second technique in that a protective layer of photoresist is spun on and baked and then etched anisotropically (e.g. oxygen plasma) so that the apexes of the tips protrude above the protective layer. The protruding metal is then etched away, thus forming the aperture. The final step is to strip away the protective layer.

Batch fabrication of micro-SILs with lithographic techniques will improve production efficiency, reduce lens aberrations, and enable integration onto scanning probes. In previous applications, SILs have been shaped with traditional lens-making techniques that are time consuming, labor intensive, and expensive. Microfabrication would enable hundreds of SILs to be made in parallel with precise and repeatable micromachining techniques. Lenses with diameters as small as 5 µm can be fabricated using standard lithographic tools, while mechanical grinding techniques have been used to make SILs down to only 1 mm. Micromachined lenses can be integrated onto MEMS structures such as scanning probes to create high-resolution tools for microscopy and other applications. An SIL fabricated on the end of an AFM could be scanned above the surface of a sample held within its near field, concentrating light on or collecting light from the sample. Such a device made of silicon or germanium, for instance, could be used for collecting light at near-infrared wavelengths. Similar SILs operating in the UV made of silicon nitride or $SiO_2$, $ZrO_2$ for instance, could be used for photolithography or microscopy, and SILs operating in the visible range or near UV made of glass, silica or zirconia could also be used for optical storage and microscopy.

As previously described, damage to the tip and sample are prevented by maintaining a gap between the tip and sample to prevent contact. The aperture-sample distance must be less than the wavelength of illuminating light source. Beyond this distance, diffraction effects would degrade the system resolution. A preferred method for maintaining the gap is based on the interference between light beams that is reflected at the base of the tip (i.e. at the silicon nitride—air interface) and light that is reflected by the sample. Referring to FIG. 13, the optical path length difference is equal to twice the aperture-sample distance. When the tip-sample distance is zero, there will be constructive interference and the intensity recorded by a photodetector 75 which detects these light beams will be a maximum. When the distance is equal to a quarter wavelength, the interference will be destructive and the detected intensity will be a minimum.

The signal generated by the interference pattern will be used as a feedback signal in a closed loop controller 77 to control the aperture-sampling spacing via the piezoelectric actuator 78. The actuator bends the cantilever in a response to an electrical signal and the piezoresistor 79 measures the strain, or force on the cantilever. The signal from the sensor is used in a feedback loop to the actuator to maintain constant force on the tip during the scanning operation. In the present example, the optical interference signal is used to drive the feedback loop to the actuator in such a way to control the tip-sample spacing at a constant level.

In the preferred embodiment described above, the solid immersion lens support has been described as an integrally formed cantilever. However, the processes described can be slightly modified to provide a solid immersion lens supported on an integral membrane. This membrane can be electrostatically deflected by applying voltages between the membrane and an adjacent surface. FIGS. 14.1–14.4 and 15 show the steps in forming a membrane-supported solid immersion lens. FIG. 14.1 shows the structure of FIG. 11. 10. The masking, FIG. 14.2, is such as to define a membrane rather than a cantilever. FIG. 14.3 shows the application of a protective polyimide coating 63. The structure is then masked and etched to form a support frame 81 and membrane 82 supporting a solid immersion lens and tip 83.

There has been described a solid immersion lens to focus light down to a small spot, flexibly supported by a cantilever or membrane, and a method of fabricating a cantilevered solid immersion lens of small diameter, on the order of a few micrometers. The definition between half power points is $$d = \frac{\lambda}{2n\sin\theta_0}$$

where $\theta_0$ is the maximum ray angle at the focus, and n the refractive index.

For infrared use as an efficient thermal detector of temperature variations in integrated circuits, we consider as an example working at a wavelength of 5 µm with a silicon SIL, which has a refractive index of 3.4. With $\sin\theta_0=0.8$, this gives a definition of d=0.92 µm.

For lithography in the near UV range, we consider the use of a nitrogen rich SiN lens to make it transparent at this wavelength. In this case, the attenuation of the light through the lens will be small and its refractive index about 1.9. So with $\sin\theta_0=0.8$, we find that the spot size is d=107 nm at a wavelength of 325 nm. To decrease the spot size still further we can work at a shorter wavelength or use metal coating with a pinhole at the same wavelength. The advantage of using the SIL in this case is that the incident power density at the pinhole will already be high, and so the efficiency will be high unlike the near-field scanning optical microscope. The present formula for nitrogen rich SiN yields a lens which is transparent to 325 nm. By making the SiN still more nitrogen rich or by using silicon oxynitride, it should be possible to work at 244 or 266 nm wavelength. In this case, the refractive index would be about 1.8, and with $\sin\theta_0=0.8$, the spot size would be 92 nm at a wavelength of 266 nm and 85 nm at a wavelength of 244 nm. Another possibility is to make the lens out of fused silica with a refractive index of 1.5. In this case, the spot size would be 102 nm at a wavelength of 244 nm.

In most cases the lens and tip are made of the same material as the cantilever. Thus, with the cavity method, SiN is deposited on the LTO, at the same time as the lens is being deposited in the cavity, to form the cantilever. For the Si lens, the silicon cantilever is formed at the same time. Likewise, in the reflow method the lens and cantilever are formed of the same material.

The foregoing descriptions of specific embodiments of the present invention are presented for the purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed:

1. A supported solid immersion lens for use in a near field optical scanning system comprising:
    a thin flexible silicon or silicon nitride support, and
    a silicon or silicon nitride solid immersion lens having a curved surface and integral tip integral with the flexible support for focusing incident optical radiation to a point opposite the curved surface.

2. A method of performing lithography on photoresist on the surface of a substrate comprising the steps of:
    bringing an array of the supported solid immersion lenses as recited in claim 1 adjacent the surface of the substrate, controlling the distance between the tips and substrate surface so that the surface is within the near field distance of light emerging from the tips, and scanning the surface relative to the tips while applying light intermittently to the solid immersion lens to expose a predetermined pattern of photoresist.

3. A supported solid immersion lens as in claim 1 in which the lens tip and flexible support are silicon nitride.

4. A supported solid immersion lens as in claim 1 or 3 in which the tip is pyramidical.

5. A supported solid immersion lens as in claim 1 or 3 in which the tip is conical.

6. A supported solid immersion lens as in claim 1 or 3 in which the tip is hemispherical.

7. A supported solid immersion lens as in claims 1 or 3 in which the solid immersion lens is between 1 and 400 microns in diameter.

8. A supported solid immersion lens as in claims 1 or 3 in which the cantilever arm, the tip, and the solid immersion lens are formed by masking and etching steps.

9. A supported solid immersion lens as in claim 8 wherein the solid immersion lens is fabricated by a cavity method.

10. A supported solid immersion lens as in claim 8 wherein the solid immersion lens is fabricated by a reflow method.

11. A solid immersion lens as in claim 8 in which the tip is formed by an oxidation sharpening method.

12. A method of performing lithography on a substrate using a layer of photoresist which comprises the steps of:

providing an array of the supported solid immersion lens as recited in claim 1, mounting on the substrate opposite the tips within the near field of light emerging from the ends of the tips, moving the substrate and supported solid immersion lens relative to one another in first and second directions which are generally perpendicular to one another, applying modulated light to each of said solid immersion lenses whereby to selectively illuminate pixels in selected lithographic patterns.

13. The method of claim 12 in which the light is modulated by deflecting the light into the solid immersion lens.

14. The method of claim 12 in which the distance between the tips and substrate is controlled by forming an interference pattern between light reflected from the substrate and from the pointed tip, and using the interference pattern to control the distance.

15. The method of claim 12 further including the step of controlling the distance between the tip and substrate by bending the flexible supports.

16. The method of claim 15 in which the step of controlling the distance includes the step of applying a superimposed AC/DC signal to a piezoelectric element attached to said cantilevers.

17. A near field optical scanning system for optically scanning an object comprising:

a flexible silicon or silicon nitride cantilever arm having a free end and a fixed end, a solid immersion lens made of material having a high refractive index for focusing light onto an integral tip, said solid immersion lens and tip being formed integral with said flexible silicon or silicon nitride cantilever arm, a light source for projecting light into said solid immersion lens whereby it emerges from the end of the tip, focused by the solid immersion lens, means for holding the object opposite the tip within the near field of focused light emerging from the solid immersion lens, and a scanner for moving the object relative to the tip whereby the emerging light scans the object.

18. A near field optical system as in claim 17 in which the material having a high refractive index has a refractive index greater than 2.

19. A near field optical scanning system as in claim 17 including:

means for detecting the distance of the tip from the object, a control system connected to the detection means and providing a distance control signal, and means for altering the distance of the tip from the object in response to the control signal.

20. A near field optical scanning system as in claim 19 in which the means for altering the distance of the tip from the object is a piezoelectric transducer.

21. A near field optical system as in claim 17 in which the tip and solid immersion lens are made of a high refractive index material.

22. A near field optical system as in claim 21 in which the high refractive index material is selected from silicon nitride, silicon, silicon oxide, strontium titanate, lead sulfide or gallium phosphide.

23. A near field optical scanning system as in claim 17 including means for deflecting the light which strikes the solid immersion lens whereby pixels are formed when the light strikes the solid immersion lens as the object is scanned.

24. The near field optical scanning system of claim 23 wherein the light is controllably deflected by a mirror.

25. An optical scanning system for scanning an object comprising:

a plurality of cantilevers formed in a wafer, each cantilever including:

a flexible cantilever arm having a free end and a fixed end, an integral transparent tip comprising a sharp end and a solid immersion lens for focusing light into the sharp end of the tip, said tip carried at the free end of said cantilever arm with the sharp end extending perpendicular to the longitudinal axis of the cantilever arm, an aperture at the sharp end of the tip, a piezoelectric transducer means on said arm for positioning the free end of the arm to position the sharp end so that near field from the sharp end impinges on the object, and means for controllably applying light to said solid immersion lens.

26. The optical scanning system as in claim 25 in which the solid immersion lens forms part of a confocal scanning microscope.

27. An optical scanning system as in claim 25 including:

means for moving the object relative to the cantilevers to scan the surface of the object with the light.

28. The optical scanning system of claim 27 in which the surface of the object is provided with a photoresist, and the light is controlled to expose a selected pattern on the photoresist.

29. The optical scanning system as in claim 27 in which the object has a magneto-optic surface and the light is controlled to magneto-optically record information on the medium.

30. A cantilever for use in an optical scanner, the cantilever comprising:

a flexible cantilever member made of silicon or silicon nitride having a free end and a fixed end, a solid immersion lens formed integral with and near the free end of the cantilever member, the solid immersion lens having a curved surface for receiving light and a tip opposite the curved surface for receiving light transiftted through the solid immersion lens.

31. The cantilever of claim 30 wherein the solid immersion lens is fabricated from a material having a refractive index greater than about 1.5.

32. The cantilever of claim 30 wherein the solid immersion lens and the cantilever member are monolithic.

33. The cantilever of claim 30 wherein the material comprising the solid immersion lens is selected from the group consisting of silicon nitride, strontium titanate, lead sulfide, and gallium phosphide.

34. The cantilever of claim 30 wherein the material comprising the solid immersion lens is silicon nitride.

35. A method of fabricating a solid immersion lens integrated with a cantilever, the method comprising the steps of:

forming a cavity in a layer of silicon material, applying a layer of high refractive index material on the surface of said silicon layer to fill said cavity and form a layer on the surface of said first layer, forming a tip in said high refractive index material on a side opposite said hemispherical cavity, and etching away said first layer to release said high refractive index material to provide a cantilever with an integral solid immersion lens.

36. The method of fabricating a solid immersion lens integrated with a cantilever, as in claim 35 including the additional step of coating said tip with a metal selected from the group consisting of aluminum, gold, silver, titanium and chrome.

37. A method of fabricating a solid immersion lens integrated with a cantilever, the method comprising the steps of:

forming a cavity in a substrate layer to define a solid immersion lens, filling said cavity and coating the surface of said substrate with a high refractive index material, planarizing said high refractive index material to remove a conformal depression, forming a tip in said high refractive index material on a side of said high refractive index material opposite said cavity, removing part of said coating of high refractive index material to define a cantilever, and etching said silicon substrate layer to release said cantilever and the solid immersion lens defined by said cavity.

38. The method of claim 37 wherein said high refractive index lens material comprises silicon nitride.

39. The method of claim 37 which includes the additional step of coating the tip with metal.

40. The method of claim 39 wherein said metal coated tip includes an aperture formed by the steps comprising:

applying a positive voltage to said tip, contacting said tip to an insulating layer of an insulator-metal composite at ground potential, thereby oxidizing said metal at an apex of said tip.

41. The method of claim 39 wherein said metal coated tip includes an aperture formed by the steps comprising:

conformally depositing a layer of silicon nitride over said tip, selectively depositing a masking layer, keeping an apex of said tip free of said masking layer, performing a timed etch to completely remove said silicon nitride and said metal at said apex of said tip, thereby creating an aperture at said apex.

42. The method of claim 39 wherein said metal coated tip includes an aperture formed by the steps comprising:

depositing a protective layer over said tip, planarizing said protective layer to expose the apex of said tip, etching said metal at said apex of said tip, thereby creating an aperture at said apex.

43. The method of fabricating a solid immersion lens and tip integrated with a cantilever which comprises:

forming a layer of high refractive index material, forming a lens shaped member of material which resists etching on the surface of said layer, etching the layer whereby to transfer the lens shape to the high refractive index material, forming a tip-shaped member of material which resists etching on the surface of the high refractive index material opposite the transferred lens shape etching the layer whereby to form at tip, and selectively etching the high refractive index material to define a cantilever with the lens at one end of the cantilever.

* * * * *